(12) United States Patent  
Di Stefano et al.

(10) Patent No.: US 9,841,461 B2  
(45) Date of Patent: Dec. 12, 2017

(54) TRANSPORT APPARATUS FOR MOVING CARRIERS OF TEST PARTS

(71) Applicant: Centipede Systems, Inc., San Jose, CA (US)

(72) Inventors: Thomas H. Di Stefano, Monte Sereno, CA (US); Peter T. Di Stefano, San Mateo, CA (US)

(73) Assignee: Centipede Systems, Inc., Santa Clara, CA (US)

( * ) Notice: Subject to any disclaimer, the term of this patent is extended or adjusted under 35 U.S.C. 154(b) by 518 days.

(21) Appl. No.: 14/628,140

(22) Filed: Feb. 20, 2015

(65) Prior Publication Data

US 2015/0177318 A1    Jun. 25, 2015

Related U.S. Application Data

(63) Continuation of application No. 12/890,530, filed on Sep. 24, 2010, now Pat. No. 8,970,244.

(60) Provisional application No. 61/246,124, filed on Sep. 26, 2009, provisional application No. 61/279,121, filed on Oct. 17, 2009, provisional application No. 61/279,358, filed on Oct. 19, 2009.

(51) Int. Cl.
  *G01R 31/20*   (2006.01)  
  *G01R 31/28*   (2006.01)  
  *G01R 1/04*    (2006.01)

(52) U.S. Cl.
  CPC ....... *G01R 31/2893* (2013.01); *G01R 1/0466* (2013.01); *G01R 31/2863* (2013.01)

(58) Field of Classification Search
  CPC ............ G01R 31/2856; G01R 31/2875; G01R 31/2877; G01R 31/26; G01R 31/2642; G01R 31/2648; G01R 31/2831; G01R 31/31702; G01R 1/0466; G01R 31/043; G01R 31/2868; G01R 31/2874; G01R 31/2893

See application file for complete search history.

(56) References Cited

U.S. PATENT DOCUMENTS

| | | | |
|---|---|---|---|
| 4,147,889 A | 4/1979 | Andrews et al. | |
| 4,881,639 A | 11/1989 | Matsuoka et al. | |
| 5,184,068 A * | 2/1993 | Twigg | B07C 5/344 209/573 |
| 5,284,413 A * | 2/1994 | Wilkinson | H05K 13/043 29/743 |
| 5,366,073 A | 11/1994 | Turrentine et al. | |
| 5,494,169 A | 2/1996 | Matsuoka | |
| 5,717,162 A | 2/1998 | Matsuoka | |

(Continued)

*Primary Examiner* — Tung X Nguyen  
(74) *Attorney, Agent, or Firm* — Michael B. Einschlag

(57) ABSTRACT

One embodiment is a transport apparatus for moving carriers of microelectronic devices along a track, the transport apparatus including: (a) a track with two rails adapted to support the carriers; (b) a trolley adapted to be transported in a direction along the track by a linear actuator; and (c) a first and a second engagement feature attached to the trolley wherein the first engagement feature is adapted to engage temporarily with a first of the carriers, and the second engagement feature is adapted to engage temporarily with a second of the carriers; wherein a predetermined movement of the trolley slidably moves the first carrier onto a test position and slidably moves the second carrier off the test position simultaneously.

18 Claims, 9 Drawing Sheets

(56) References Cited

U.S. PATENT DOCUMENTS

| | | | |
|---|---|---|---|
| 5,731,230 A | * | 3/1998 | Nevill ............... H01L 21/67333 438/15 |
| 5,742,487 A | | 4/1998 | Kobayashi et al. |
| 5,758,776 A | | 6/1998 | Slocum et al. |
| 5,786,704 A | | 7/1998 | Kim |
| 5,960,961 A | | 10/1999 | Gutentag |
| 6,019,564 A | | 2/2000 | Kiyokawa et al. |
| 6,021,904 A | | 2/2000 | Kozol et al. |
| 6,163,145 A | | 12/2000 | Yamada et al. |
| 6,179,127 B1 | | 1/2001 | Kato et al. |
| 6,313,652 B1 | | 11/2001 | Maeng |
| 6,384,593 B1 | | 5/2002 | Kobayashi et al. |
| 6,474,477 B1 | | 11/2002 | Chang |
| 6,522,125 B2 | | 2/2003 | Sagawa |
| 6,535,007 B2 | | 3/2003 | Haas et al. |
| 6,627,483 B2 | | 9/2003 | Ondricek et al. |
| D496,339 S | | 9/2004 | Stanley |
| 6,864,568 B2 | | 3/2005 | Kohno et al. |
| D589,010 S | | 3/2009 | Di Stefano |
| D589,011 S | | 3/2009 | Di Stefano |
| 7,528,617 B2 | | 5/2009 | Cojocneanu et al. |
| 2002/0057963 A1 | | 5/2002 | Peterson et al. |
| 2004/0155646 A1 | | 8/2004 | Hoppe |
| 2005/0012498 A1 | | 1/2005 | Lee et al. |
| 2006/0071656 A1 | | 4/2006 | Joung et al. |
| 2006/0226000 A1 | | 10/2006 | Hanson et al. |
| 2007/0040570 A1 | | 2/2007 | Gopal et al. |
| 2008/0079456 A1 | | 4/2008 | Lee |
| 2008/0252317 A1 | | 10/2008 | Hopkins et al. |
| 2009/0189631 A1 | | 7/2009 | Shimada et al. |
| 2010/0206768 A1 | | 8/2010 | Hoffmann |
| 2010/0230885 A1 | | 9/2010 | Di Stefano |
| 2011/0165531 A1 | | 7/2011 | Matsuura et al. |

\* cited by examiner

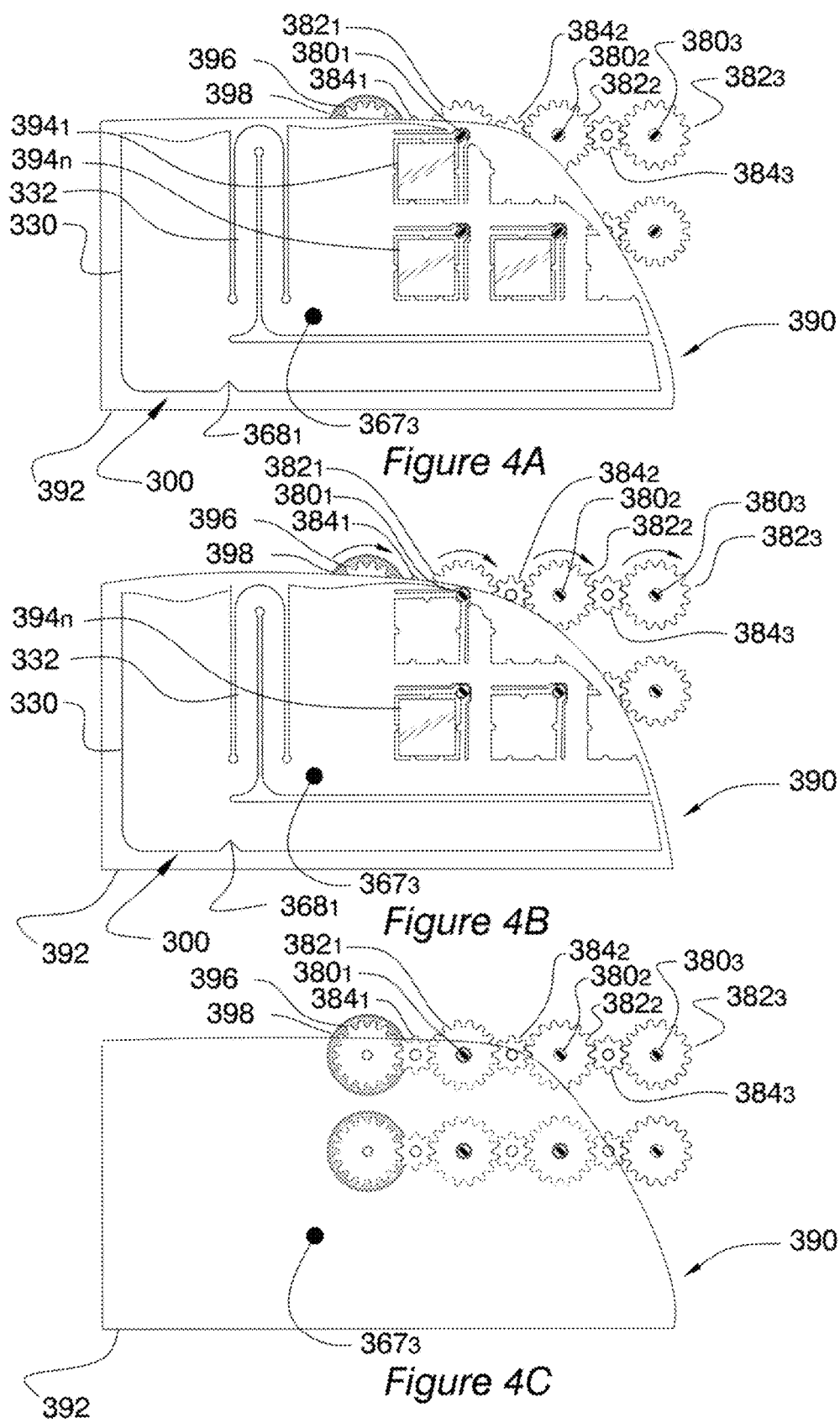

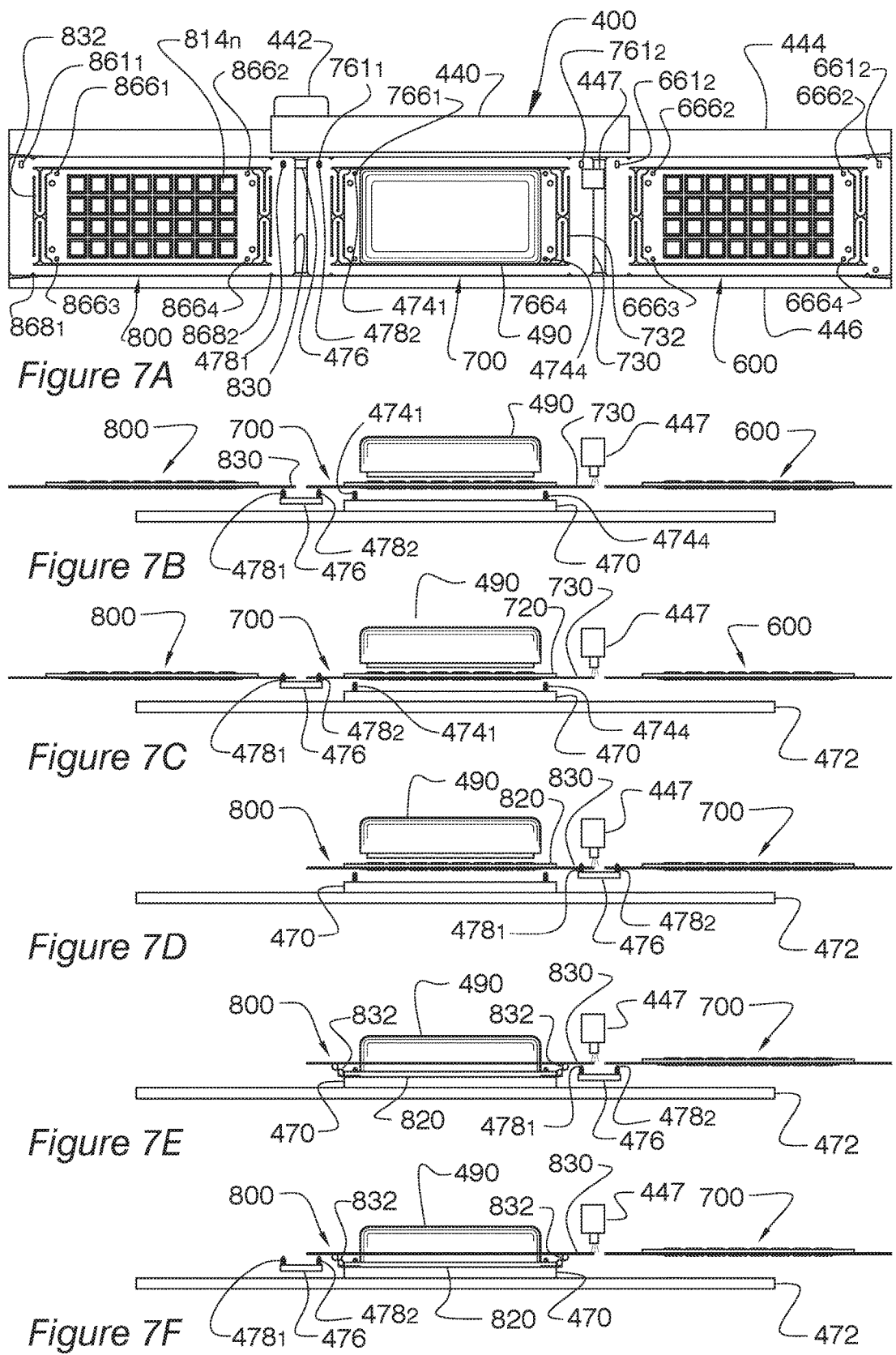

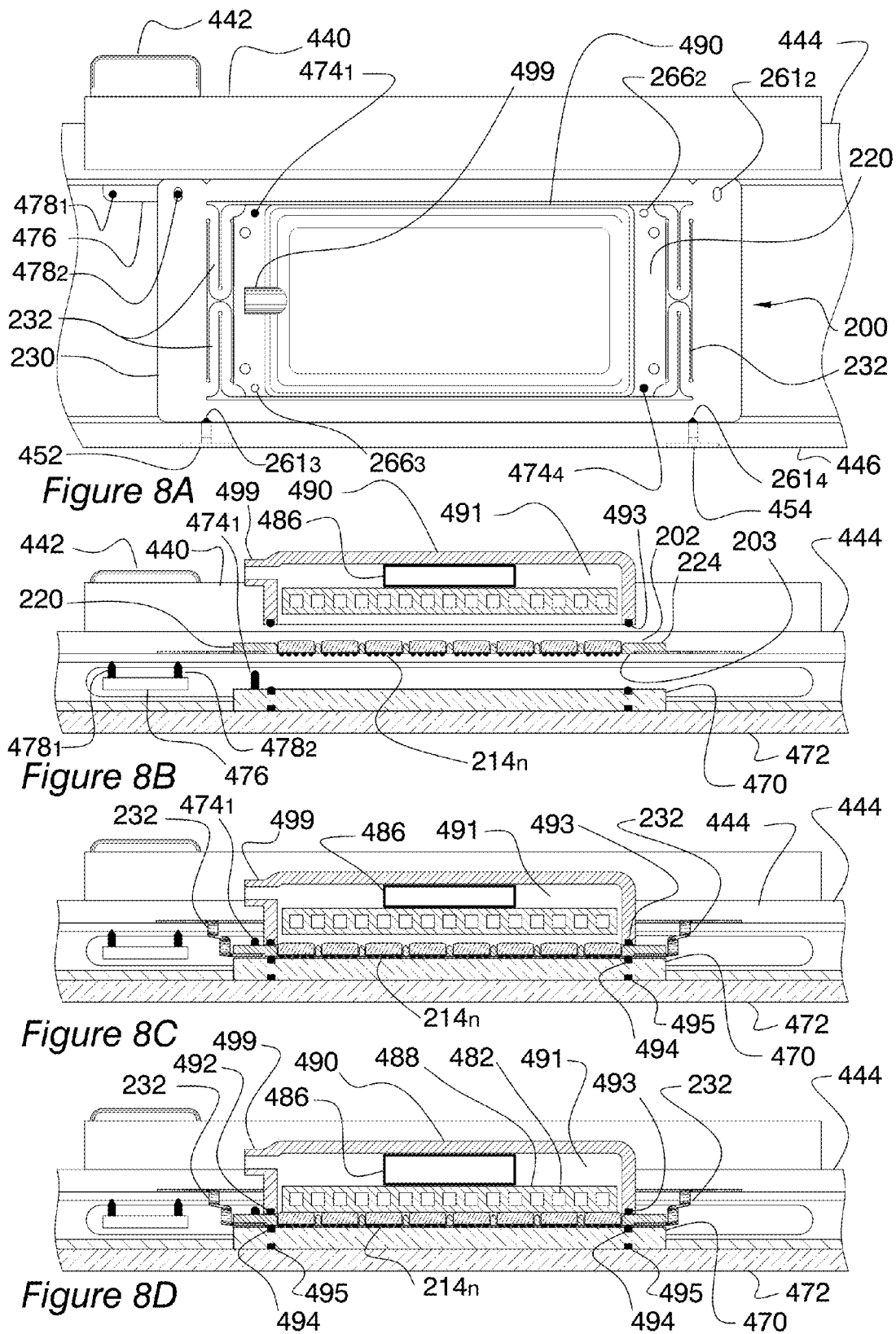

TRANSPORT APPARATUS FOR MOVING CARRIERS OF TEST PARTS

This patent application is a continuation of a patent application entitled "Transport Apparatus for Moving Carriers of Test Parts" having Ser. No. 12/890,530 which was filed on Sep. 24, 2010 Now U.S. Pat. No. 8,970,244 and which is incorporated herein in its entirety, and which patent application is a nonprovisional patent application of U.S. Provisional Application No. 61/246,124 filed Sep. 26, 2009, U.S. Provisional Application No. 61/279,121 filed Oct. 17, 2009 and U.S. Provisional Application No. 61/279,358 filed Oct. 19, 2009 from which U.S. provisional applications priority is claimed under 35 USC §119(e), and which provisional applications are incorporated herein in their entirety.

TECHNICAL FIELD OF THE INVENTION

One or more embodiments of the present invention relate to transporting carriers of test parts such as, for example and without limitation, microelectronic devices, to enable one or more procedures such as, for example and without limitation, test and/or burn-in, and more specifically to method and apparatus for transporting an array of microelectronic devices in a movable tray adapted for making electrical contact to an electronic test equipment.

BACKGROUND

Semiconductor processing is an increasingly complex and mature technology for which the cost of test and burn-in consumes an ever larger share of production costs. However, continuous progress is being made in semiconductor technology and wafer fabrication efficiency where such progress can be characterized by Moore's law which has successfully predicted a doubling of the number of devices on a semiconductor chip every two years. Productivity gains from advances in semiconductor technology and wafer fabrication efficiency underlie the modern economy, making possible mobile electronics, Internet communications and much of modern life. However, semiconductor packaging and testing have not maintained the same pace of technological progress.

Methods commonly used for contacting individual, separated semiconductor chips during testing have remained largely the same for decades. For example, after wafer probe testing, a wafer is sawn apart into individual chips. Then, additional packaging steps may be used to protect the chip and facilitate its attachment to an electronic system. After packaging, each chip is inserted into a first socket to test for opens and shorts. Each chip is then released from the first socket and transported in a tray. In an optional next step, the chip is inserted into a second (burn-in) socket and burned-in for eight hours at an elevated temperature of about 125° C. After burn-in, the chip is removed from the burn-in socket and transported in a tray to final test where it is inserted into a third socket. A comprehensive set of tests is done in final test, which tests are typically done at several speeds, voltages and temperatures. The socketing, sockets, fixtures, test boards and handling involved with the process of testing individual chips and other microelectronic devices present increasing problems in streamlining the production of semiconductor devices.

Attempts have been made to eliminate the need for individual sockets in test and burn-in, with limited success, in certain segments of the industry. For example, wafer probe testing using full wafer contactors has been used to test and burn-in all chips on a wafer in parallel, simultaneously. In DRAM and FLASH memory production, wafer probe testing is now being done in parallel for each chip on a wafer. However, at present, cost and performance limitations prevent the practical use of full wafer contactors to burn-in and performance test all chips on a wafer. In particular, for more complex chips, such as microprocessors, signal processors, ASICS and communications chips, the high I/O count, power and performance associated with these complex chips prevent use of full wafer contactors for anything other than simple wafer probe testing at best. Although considerable resources, including work in university, U.S. government and industrial laboratories, have been devoted to full wafer burn-in and speed testing, the problem of finding a practical solution remains unsolved.

Other attempts to test and burn-in devices have been made which entail contacting a strip of partially packaged chips. In the process of packaging semiconductor chips as chip scale packages (CSPs) or ball grid arrays (BGAs), an array of chips is held together in a strip format. An array contactor is then used to test and burn-in arrays of chips in the strip format by having the array contactor contact terminals on each partially packaged chip without using an individual chip socket. After testing, the process of packaging the chips is completed, and the strip is sawn into individual finished devices. While testing in a strip format eliminates the need for individual costly sockets for some electrical tests, strip testing is only applicable to packages that are processed in strip format. Dimensional stability limits the application of testing in a strip format to relatively small array sizes and low densities due to problems with alignment of terminals on devices to corresponding contactors. A further limitation results from a complication of the process flow wherein devices leave a packaging area to be tested in a test facility, and then return to packaging for finishing and singulation into individual devices.

Another approach involves placing chips, whether packaged or not, in an accurately positioned array on a carrier. The carrier is moved automatically through the process on tracks or belts. In order to test devices in the carrier, the carrier is physically picked up and placed accurately on the contactor. After testing, the carrier is extracted from the contactor and physically placed back on a track for automatic transport to a next operation. A complex, slow and expensive mechanical apparatus is required to place the carrier accurately on a mating contactor.

SUMMARY

One or more embodiments of the present invention solve one or more of the above-identified problems by providing a transport mechanism that moves a first tray of devices onto a test position while simultaneously moving a second tray of devices off the test position. The devices, for example and without limitation, microelectronic devices, are disposed in an array of apertures in each tray. In accordance with one or more embodiments of the present invention, a tray is resiliently supported by flexural springs to a planar frame wherein the tray is movable in a direction perpendicular to the tray. In a test procedure the tray is moved into a test position between a test head and a juxtaposed contactor, wherein the test head moves toward the tray, thereby urging the devices into electrical contact with corresponding contacts of the contactor.

BRIEF DESCRIPTION OF THE DRAWINGS

FIGS. 4A-4B are top cutaway views of a portion of a carrier for holding an array of microelectronic devices in conjunction with a mechanism for loading and unloading devices from the carrier, which carrier and mechanism are fabricated in accordance with one or more embodiments of the present invention.

FIG. 4C is a top cutaway view of the mechanism for loading and unloading devices shown in FIGS. 4A and 4B.

FIG. 7A is a top view of a transport mechanism with a first carrier in an output position, a second carrier in a test position under a test head, and a third carrier in an input position, which transport mechanism and carriers are fabricated in accordance with one or more embodiments of the present invention.

FIGS. 7B-7F are simplified side views of the transport mechanism and the first, second and third carriers shown in FIG. 7A which help illustrate a sequence of steps for moving the first carrier from the output position, and subsequently for moving the second carrier from the test position to the output position while simultaneously moving the third carrier from the input position to the test position.

FIG. 8A is a top view of a test position wherein a test head is positioned over a tray carried by a frame, which test position is fabricated in accordance with one or more embodiments of the present invention.

FIGS. 8B-8D are cross sectional views of the test position shown in FIG. 8A for testing arrays of microelectronic devices held in a tray supported on a frame of a carrier that is fabricated in accordance with one or more embodiments of the present invention, where: (a) FIG. 8B shows the tray in a retracted configuration; (b) FIG. 8C shows a test head urging the tray to an extended configuration; and (c) FIG. 8D shows the tray in the extended configuration while a thermal plate is urged into contact with an array of devices under test.

DETAILED DESCRIPTION

Figure 1:
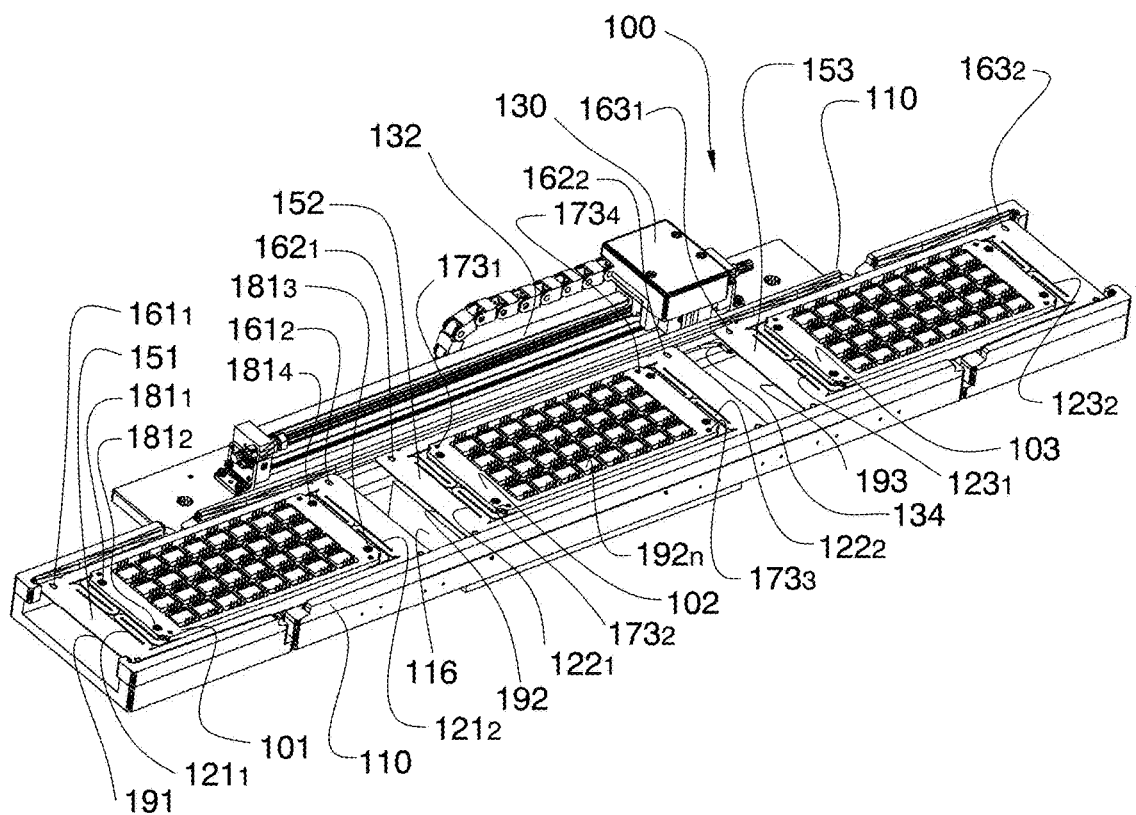
FIG. 1 is a perspective view of a transport mechanism for moving carriers for holding microelectronic devices onto and off a test site, which transport mechanism is fabricated in accordance with one or more embodiments of the present invention.

In accordance with one or more embodiments of the present invention, a transport mechanism is used to move carriers to positions to carry out test and burn-in operations. A carrier is provided for holding devices, for example and without limitation, microelectronic devices, in place in an array so the devices may be: (a) moved to a test position that includes, for example and without limitation, a contactor block (the term "contactor block" refers to an array of connectors or contactors, and the term "contactor" refers to a connector such as, for example and without limitation, a spring pin such as a Pogo® spring pin) such as, for example and without limitation, a test socket; and (b) aligned with mating contactors, for example and without limitation, test contactors (for example, an electrode terminal of a socket), in the contactor block, for example and without limitation, the test socket.

As used herein, the term device is used in the broadest sense and includes, without limitation, an electronic device and a microelectronic device including a semiconductor chip, a flip chip, a packaged electronic circuit, a hybrid circuit, a daughter card, a multi-chip module, and the like. As further non-limiting examples of the types of microelectronic devices which may be held in a carrier fabricated in accordance with one or more embodiments of the present invention are BGAs (as used herein the term BGA, or ball grid array, is a two dimensional array of solder bump terminals on a microelectronic device), CSPs (as used herein, the term CSP is a chip scale package), flip-chips, wafer level packages (WLPs), TSVs (as used herein, the term TSV is a through silicon via device), bare semiconductor dice, MEMS, and multi-chip modules.

As used herein, the terms up, down, top and bottom generally refer to an orientation with respect to figures showing aspects of embodiments of the present invention. These terms are not intended to describe orientation with respect to a gravitational field, but rather are used to facilitate description of aspects of embodiments of the present invention as illustrated in the figures. As used herein, the expression "respectively" means that a first item in a first list relates to a first item in a second list; a second item in the first list relates to a second item in the second list; and so forth.

In accordance with one or more embodiments of the present invention, a carrier comprises a frame that is resiliently coupled to a tray, which frame includes two or more flexible links, for example and without limitation, springs that are disposed so the tray may be resiliently moved relative to the frame (for example and without limitation, moved perpendicular to a plane associated with the frame such as an aperture in which the tray may be disposed). In accordance with one or more such embodiments, the tray includes a plurality of apertures disposed in an array of sites, wherein each site is a location within the tray that is adapted to hold a unitary module, (typically a unitary module is one device; however, the unitary module may be comprised of multiple devices). The each aperture may extend completely through the tray, or alternatively, extend partially through the tray. In accordance with one or more embodiments of the present invention, a carrier comprises a tray that is separable from, and is attachable to, a frame, for example and without limitation, by attachment to springs or to a structure that is coupled to the springs—for example and without limitation, the tray may be a molded plastic tray with apertures therethrough. Alternatively, in accordance with one or more further embodiments of the present invention, a carrier comprises a frame that includes a tray and flexible links that are disposed so the tray may be resiliently moved relative to the frame (for example and without limitation, moved perpendicular to a plane associated with the frame such as an aperture in which the tray may be disposed), wherein the tray is an integral part of the frame.

FIG. 1 is a perspective view of transport mechanism 100 for moving a plurality of devices on carriers of various types through a sequence of test locations to carry out a sequence of test operations. Carriers 151-153 are slidably supported on rails 110 for use in testing and/or burn-in testing in accordance with one or more embodiments of the present invention. As shown in FIG. 1, rails 110 support carriers 151-153, each of which carriers 151-153 includes a mesh of serpentine flat springs (springs $121_1$ and $121_2$; springs $122_1$ and $122_2$; and springs $123_1$ and $123_2$, respectively) that form spring beds for trays 101-103, respectively. In operation, serpentine flat springs $122_1$ and $122_2$ provide resiliency that enables devices held in tray 102 to be urged by a test head (not shown) mounted above tray 102 downwardly into contact with socket 116 mounted below tray 102. As further shown in FIG. 1, trays 101-103 are held in place on frames 191-193 of carriers 151-153, respectively, by four (4) fasteners (for example, PEM nuts $181_1$-$181_4$ affixed to tray 101). As further shown in FIG. 1, pin carrier 134 on mobile trolley 130 mounted to pneumatic drive 132 transports carriers 151-153 along a track having rails 110 (as used herein, the term "track" is a guide having with two or more rails for holding carriers slidably). Pins (not visible in FIG. 1) on pin carrier 134 engage with transport apertures $162_2$ and $163_1$ on frames 192 and 193, respectively, thereby enabling mobile trolley 130 to move carriers 152 and 153 into position simultaneously. In FIG. 1, carrier 151 is in an input position, carrier 152 is in a test position, and carrier 153 is in an output position. Each end of frames 191, 192 and 193 has one or more transport apertures (transport apertures $161_1$ and $161_2$; transport apertures $162_1$ and $162_2$; and transport apertures $163_1$ and $163_2$, respectively) that enable engagement for transport from either end of the frames. As further shown in FIG. 1, apertures in the trays (for example, apertures $173_1$-$173_4$ disposed in tray 102) may be used to align the trays with registration pins on test sockets. In accordance with one or more further embodiments of the present invention, the carriers may be transported by robots, slides, belts, magnetic levitation tracks, a pin carrier moved by a linear motor, a lead screw, a ball screw, a belt drive, a stepper motor (with cable and pulleys) and the like, or manually, all of which embodiments may be fabricated routinely and without undue experimentation by one of ordinary skill in the art in light of the description herein. Further, in accordance with one or more embodiments of the present invention, various identification marks, alignment features, tracking labels and the like may be added to a carrier in accordance with any one of a number of methods that are well known to one of ordinary skill in the art of conventional semiconductor packaging and testing.

Figure 2A:
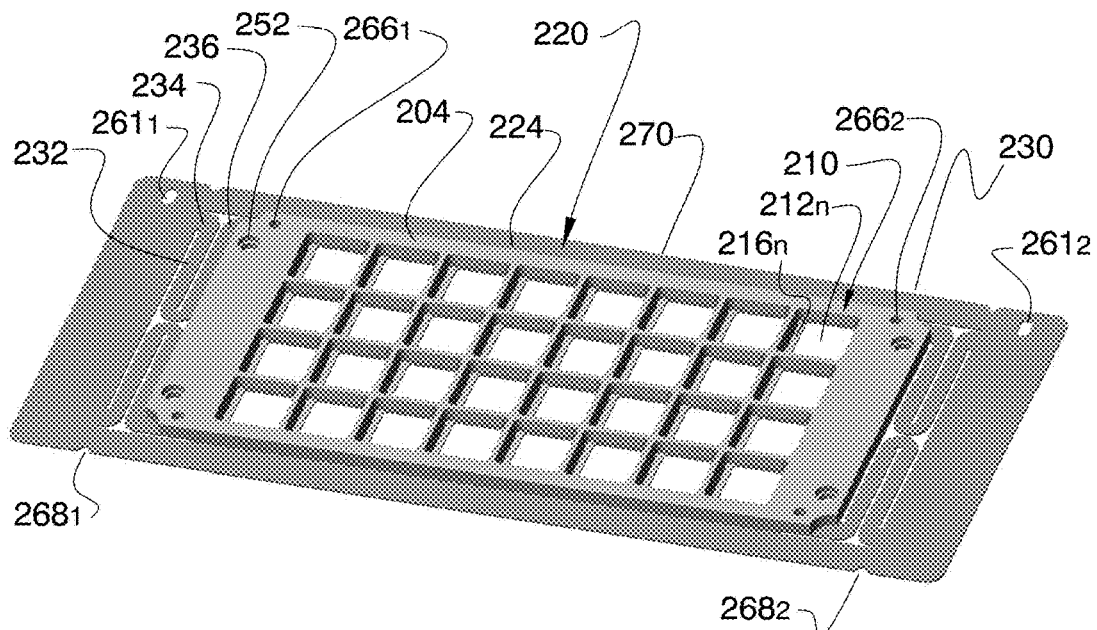
FIGS. 2A and 2B are perspective views of a carrier for holding microelectronic devices, which carrier is fabricated in accordance with one or more embodiments of the present invention, the carrier being shown in a retracted configuration in FIG. 2A and in an extended configuration in FIG. 2B.
Figure 2B:
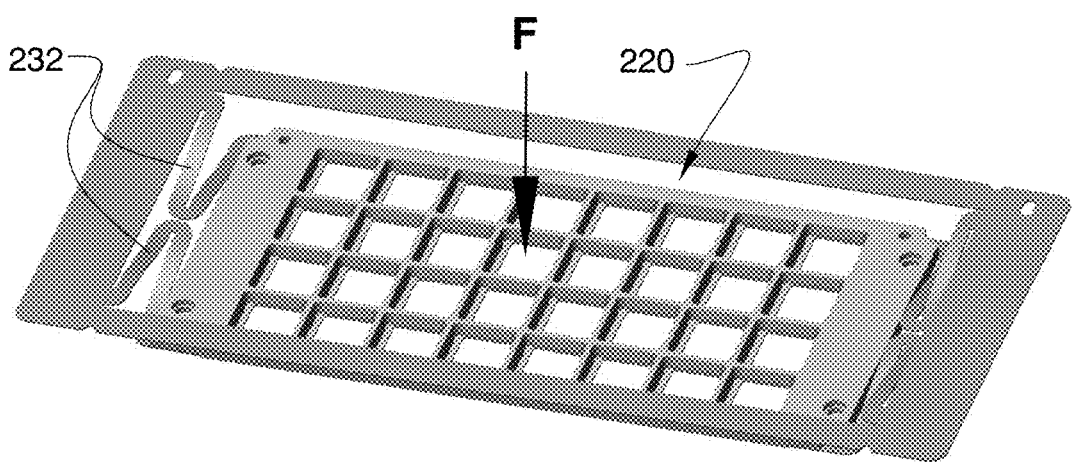
Figure 3A:
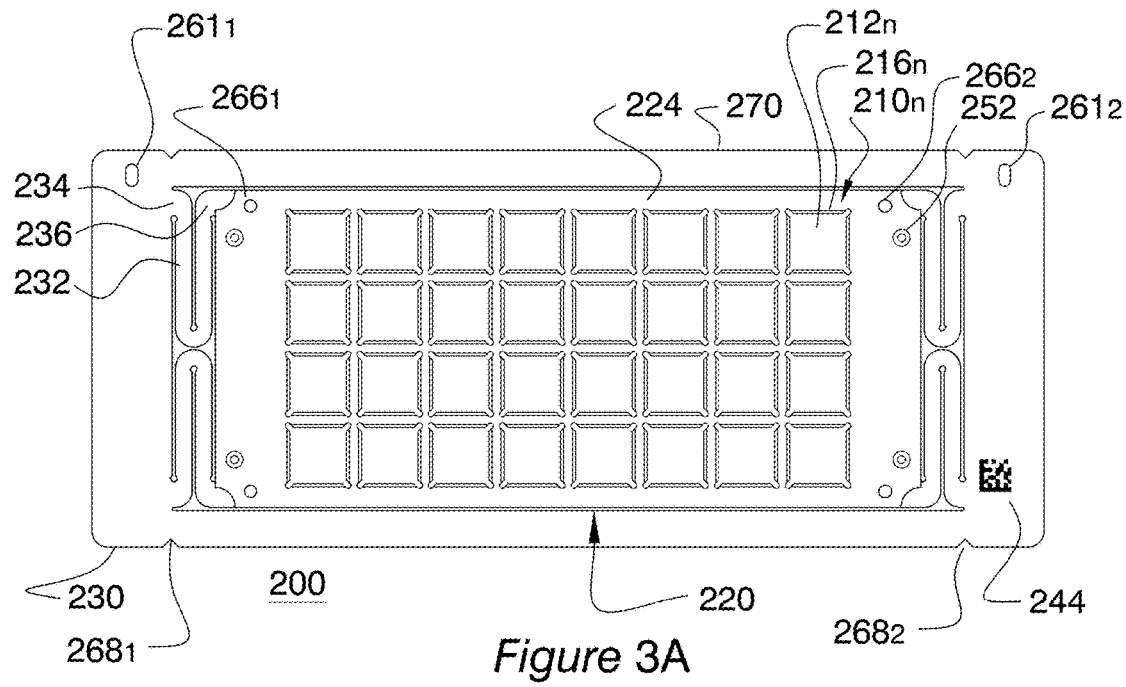
FIGS. 3A and 3B are top views of carriers for holding an array of microelectronic devices, which carriers are fabricated in accordance with one or more embodiments of the present invention.
Figure 3B:
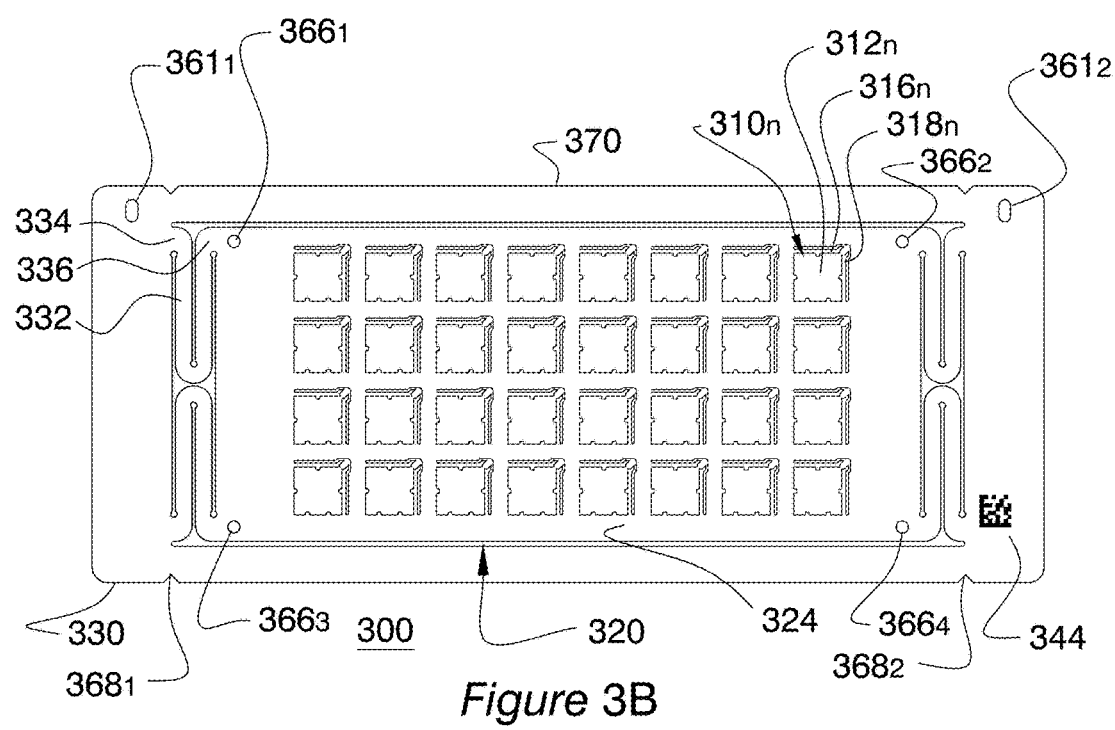

Modalities of the operation of one or more embodiments of the present invention may be understood better by reference to carriers shown in FIGS. 2A and 2B and in FIGS. 3A and 3B. FIGS. 2A and 2B are perspective views of carrier 200 for holding microelectronic devices, which carrier 200 is fabricated in accordance with one or more embodiments of the present invention. FIG. 2A shows carrier 200 with tray 220 in a retracted configuration, while FIG. 2B shows carrier 200 with tray 220 in an extended configuration. In use, microelectronic devices (not shown) are held in a plurality of apertures $212_n$ at sites $210_n$ of tray 220, thereby enabling the devices to be transported, in alignment as a group, by carrier 200 to and from contactors for making temporary test connections to the devices so transported. For clarity of exposition and ease of understanding, numerical labeling of repeated elements, for example sites $210_n$, are omitted as having been defined for a typical element. Each of an array of devices resides in an aperture $212_n$ at site $210_n$ of tray 220. A device at site $210_n$ is prevented from falling through aperture $212_n$ by retaining feature $216_n$ which is, by way of example and without limitation, a ledge. As further shown in FIGS. 2A and 2B, tray 220 is resiliently coupled to frame 230 of carrier 200 by attachment to flexural springs 232, thereby enabling tray 220 to be moved resiliently relative to frame 230 (for example, in a direction perpendicular to a plane of an opening in frame 230) by flexing flexural springs 232. Flexural springs 232 of FIG. 2A are sheets of resilient metal cut to form two legs of substantially equal length whereby tray 220 moves in a direction perpendicular to the plane of carrier 200 when moving from a retracted position shown in FIG. 2A to an extended position shown in FIG. 2B. As further shown in FIGS. 2A and 2B, tray 220 includes alignment features $266_n$ that may be used to position tray 220 accurately with respect to a mating element such as, for example and without limitation, a contactor block, test socket, a burn-in socket, or a processing head. As further shown in FIGS. 2A and 2B, frame 230 includes slots $261_1$ and $262_2$ disposed at each end thereof which are useful in engaging transport mechanisms for moving carrier 200 from one station to another. As further shown in FIGS. 2A and 2B, frame 230 includes: (a) side sections 270 having surfaces adapted to be slidably supported on rails (not shown in FIGS. 2A and 2B); and (b) notches $268_1$ and $268_2$ disposed along a side section of frame 230 to enable alignment, for example and without limitation, by means of shot pins (not shown) that engage the notches laterally in response to a force being applied thereto in the plane of frame 230.

In accordance with one or more embodiments of the present invention, apertures $212_n$ may extend through the body of tray 220 to enable access to top surfaces of devices (not shown), for example and without limitation, for direct chip cooling, while enabling access to bottom surfaces of the devices, for example and without limitation, for connection to contactor probes of a test socket. Alternatively, apertures $212_n$ may have a bottom structure $216_n$ (for example, refer to FIG. 2A) so that devices held therein are prevented from falling downward and out of aperture $212_n$. In accordance with one or more such alternative embodiments of the present invention, the bottom structure may comprise one or more tabs, one or more ledges, one or more protrusions, a thin sheet with a grid of holes therethrough, a sheet of material with or without apertures therein, and so forth. In accordance with one or more such embodiments, the bottom structure comprises a thin sheet of copper, copper alloy, steel, polyimide, or other suitable material. In accordance with one or more further embodiments, the bottom structure comprises a thin sheet with embedded contactors disposed through the sheet whereby electrical connections may be made between terminals on bottom surfaces of devices and corresponding terminals of a mating socket. Embedded contactors may include, without limitation, terminals with roughened surfaces, spring probes, resilient metal vias, cantilever probes, buckling beam probes, flat spring probes, and the like.

While tray 220 (which is fabricated to have a multiplicity of sites like site 210$_n$ shown in FIG. 2A), as shown in FIGS. 2A and 2B, is substantially planar, it will be understood by one of ordinary skill in the art that trays fabricated in accordance with one or more embodiments of the present invention may include additional features that facilitate loading and unloading of various types of microelectronic devices. For example and without limitation, beveled "picture frames" may be added to each site 210$_n$ to guide devices into apertures like aperture 212$_n$. In accordance with one or more such embodiments of the present invention, beveled picture frames may be formed individually, i.e., with one picture frame per site, or beveled picture frames may be formed in an array that is attached to a planar tray 220. As used herein, a picture frame, typically fabricated from molded plastic material, is a frame that is used to guide a device into an aperture in the tray. As one of ordinary skill in the art can readily appreciate, many embodiments of tray 220 may be fabricated that include variations from the beveled picture frames described above. For example and without limitation, a portion of a picture frame need not surround each site (for example, a picture frame portion associated with a site need not include four (4) sides), or even be present at each site. In addition, the tray may include prongs activated by cams that open the prongs and allow a device to be inserted into the site.

In accordance with one or more embodiments of the present invention, tray 220 may be fabricated using any one of a number of conventionally practiced methods of plastic molding. For example and without limitation, suitable plastics for fabricating trays include: FR-4 epoxy, liquid crystal polymer, polyether ether ketone (PEEK), polyether sulfone (PES), and polyamide-imide (Torlon® available from Quadrant Engineering Plastics, Reading, Pa.) and Semitron 410C Ultem® plastic material available from Boedeker Plastics of Shiner, Tex. (Ultem is a trademark of GE Plastics). Tray 220 may also be fabricated of an insulative material or a metal with an insulative coating. For example and without limitation, a dielectric material of a high performance tray may be selected from a group of dimensionally stable polymer materials including, for example and without limitation: glass reinforced Torlon 5530 available from Quadrant Engineering Plastics, of Reading Pa.; Vespel; Ultem 2000 available from GE Inc.; carbon filled PEEK; liquid crystal polymer; aramid fiber reinforced polyimide sheet; and others. A high degree of dimensional stability may be achieved with trays of metals such as, for example and without limitation, brass, stainless steel, titanium alloy 6al-4v, or aluminum 7075, the metal body being provided with an insulative conformal coating of one or more dielectric materials that are well known in the electronic circuit board industry.

In accordance with one or more embodiments of the invention, and as shown in FIG. 2A, tray 220 includes seal band 224 which encircles sites 210$_n$ to provide a top sealing surface 204 for tray 220 when carrier 200 is used in the manner described below. In accordance with one or more such embodiments of the present invention, and as shown in FIG. 2A, seal band 224 is a solid band of material around a periphery of tray 220 that encircles device receiving sites 210$_n$. In accordance with one or more such embodiments, top surface 204 of seal band 224 provides a top sealing surface for tray 220, and a portion of a bottom surface of tray 220, for example, a flat portion, provides a bottom sealing surface for tray 220. In accordance with one or more such embodiments, seal band 224 is a solid band of material disposed on, or formed as a portion of, tray 220 (refer to FIG. 2A).

As shown in FIGS. 2A and 2B, flexural springs 232 are serpentine folded flat springs wherein ends 234 and 236 of springs 232 are in close proximity to reduce movement of tray 220 that is not in a direction perpendicular to a plane of frame 230. A force F (refer to FIG. 2B) acting upon tray 220 in a direction perpendicular to the plane of frame 230 displaces tray 220 to an extended configuration shown in FIG. 2B. Upon release of force F, tray 220 returns to a retracted configuration shown in FIG. 2A. The term "retracted configuration" refers a configuration of tray 220, and hence springs 232, for example and without limitation, where no external forces other than gravity act upon tray 220.

In accordance with one or more embodiments of the present invention, frame 230 may be fabricated from a sheet of full hardness, tempered 304 stainless steel having, for example and without limitation, a thickness of about 0.50 mm. In accordance with one or more such embodiments, the features of frame 230 shown in FIGS. 2A and 2B and described above may be laser cut in the full hardness, tempered 304 stainless steel sheet to an accuracy of ±5 micrometers. In accordance with one or more alternative embodiments, frame 230 may be fabricated from a material including, without limitation, stainless steel, tempered steel, Monel 500, glass fiber reinforced polyimide, aramid fiber reinforced polyimide (available from Arlon Materials for Electronics, a Division of WHX Corporation, of Rancho Cucamonga, Calif.), NiTi shape memory alloy (available from National Electronic Alloys, Inc. of Santa Ana, Calif.), carbon fiber reinforced polymer, or a resilient plastic material.

As shown in FIGS. 2A and 2B, and in accordance with one or more embodiments of the present invention, tray 220 is resiliently coupled to frame 230 by attachment to springs 232. In accordance with one or more such embodiments, tray 220 is attached to springs 232 by fastening means 252 which, for example and without limitation, may be PEM® nuts available from PEM Fastening Systems of Danboro, Pa.

FIGS. 3A and 3B are top views of carriers 200 and 300, respectively, for holding an array of microelectronic devices, which carriers are fabricated in accordance with one or more embodiments of the present invention. As shown in FIG. 3A, data matrix serialization mark 244 is positioned near one end of frame 230 and is provided for use in automatic machine reading an identity of carrier 200 by, for example and without limitation, an optional sensor on a transport apparatus. Mark 244 is fabricated in accordance with any one of a number of methods that are well known to those of ordinary skill in the art, and it enables tracking devices in tray 220 for forward and backward traceability from, for example and without limitation, picking a device from a sawn semiconductor wafer to, for example and without limitation, packing the device for final shipment. For example and without limitation, data specifying the location of devices in sites of a carrier may be collected by factory mechanization computers in accordance with any one of a number of methods that are well known to those of ordinary skill in the art. This data may be correlated, for example and without limitation, by such factory mechanization computers or by other computers, with data relating to the various process steps entailed in fabricating and testing devices to enable forward and reverse traceability of the devices at any subsequent process or testing step and so forth performed while the devices are held in the carrier.

FIG. 3B shows carrier 300 which is fabricated in accordance with one or more embodiments of the present invention wherein frame 330 and tray 320 are fabricated from a unitary sheet of material. In accordance with one or more such embodiments, the thickness of carrier 300 may range from (for example and without limitation, using a thin sheet of 304 stainless steel) about 0.1 mm in thickness for use, for example and without limitation, in flip chip applications to (for example and without limitation, using a molded plastic sheet) about 5.0 mm in thickness for use, for example and without limitation, with a MEMS pressure sensor device. As further shown in FIG. 3B, tray 320 is depended on flexural springs 332 from frame 330, thereby allowing tray 320 to move relative to support rails 370 of frame 330. As further shown in FIG. 3B, flexural springs 332 are attached at proximal ends 336 to tray 320, and at distal ends 334 to frame 330. In accordance with one or more embodiments of the present invention, stiffness of a body of a frame such as frame 300 may be increased by embossments, flanges, j-flanges, folds, and other stiffeners known in the art. As further shown in FIG. 3B, alignment features $366_1$-$366_4$ are disposed in tray 320, which alignment features are provided to enable engagement with alignment elements on a mating contactor block during a process of urging tray 320 downwardly onto the contactor block as will be described below. As further shown in FIG. 3B, slots $361_1$ and $361_2$ are disposed in frame 330, which slots are adapted for engagement with transport mechanisms for slidably moving carrier 300 along the rails of a track. As further shown in FIG. 3B, notches such as $368_1$ and $368_2$ are provided along a side section of frame 330 to enable engagement, for example and without limitation, with shot pins (as will be described below) that hold frame 330 in a predetermined position along rails of a track.

As further shown in FIG. 3B, tray 320 includes an array of sites $310_n$ having apertures $312_n$ for receiving microelectronic devices (not shown). As further shown in FIG. 3B, each site $310_n$ includes a pair of resilient prongs $316_n$ and $318_n$ that are adapted for holding a device in position in tray 320. Seal band 324 encircles sites $310_n$ with solid material which provides a top sealing surface for tray 320, and a bottom surface of tray 320 provides a bottom sealing surface for tray 320. Optionally, carrier 300 is provided with a machine readable mark 344 for identification and machine control. For example, and without limitation, mark 344 is a data matrix used to uniquely identify carrier 300 for process and transport control. Mark 344 allows tracking of devices in tray 320 for forward and backward traceability from picking a device from a sawn semiconductor wafer to packing the device for final shipment.

FIGS. 4A-4B are top cutaway views of a portion of carrier 300 (refer to FIG. 3B) for holding an array of microelectronic devices $394_n$ in conjunction with mechanism 390 for loading and unloading devices from carrier 300-carrier 300 and mechanism 390 are fabricated in accordance with one or more embodiments of the present invention. In accordance with one or more embodiments of the present invention, microelectronic devices $394_n$ are inserted into and extracted from apertures at sites $310_n$ utilizing mechanism 390 (for example and without limitation, cam apparatus 390) shown in FIGS. 4A-4C. For ease of understanding, it may be understood that each of devices $394_1$-$394_n$ is equivalent and that the labels are interchangeable.

In accordance with one or more embodiments of the present invention, tray 320 of carrier 300 is aligned to cam apparatus 390 by mating alignment features $366_1$-$366_4$ (refer to FIG. 3B) with alignment pins, for example, pin $367_3$ on support plate 392 of cam apparatus 390. In a process of aligning and mounting carrier 300 to cam apparatus 390 in accordance with one or more embodiments of the present invention, each of cams $380_1$-$380_n$ is inserted between corresponding pairs of prongs $316_1$ and $318_1$ to $316_n$ and $318_n$ of tray 320 (refer to FIGS. 3B, 4A and 4B). Next, cams $380_1$-$380_n$ are rotated, for example and without limitation, by about 90°, thereby urging each cam $380_n$ against resilient prongs $316_n$ and $318_n$ so that prongs $316_n$ and $318_n$ are spread apart to release force on device $394_n$ to enable its removal from aperture $312_n$ in site $310_n$. Correspondingly, cams $380_1$-$380_n$ may be rotated so as to urge against prongs $316_n$ and $318_n$ and open aperture $312_n$ so that device $394_n$ may be inserted into aperture $312_n$, and then rotated back to enable prongs $316_n$ and $318_n$ to hold device $394_n$.

FIG. 4C is a top cutaway view of cam apparatus 390 where elements behind mounting plate 392 are shown in phantom. In accordance with one or more such embodiments, mounting plate 392 has a coefficient of thermal expansion (CTE) that is matched to a CTE of carrier 300, and in particular, of tray 320. In accordance with one or more such embodiments, cam apparatus 390 moves cams $380_n$ in concert so that each cam is rotated through about 90° by mechanical linkages. In accordance with one or more such embodiments of the present invention, the mechanical linkages comprise gears 396 mounted to shafts of motors 398; cams $380_1$-$380_n$ mounted to cam gears $382_1$-$382_n$; and spur gears $384_1$-$384_n$. In accordance with one or more such embodiments, motor 398 rotates gear 396 clockwise, which gear 396 rotates spur gear $384_1$ counterclockwise, which spur gear $384_1$, in turn, rotates cam gear $382_1$ clockwise, which cam gear $382_1$, in turn, rotates spur gear $384_2$ counterclockwise, which spur gear $384_2$ rotates cam gear $382_2$ clockwise, and so forth. In the manner described above, all of cams $380_1$-$380_n$ are rotated through a set angle so that a pair of prongs at a site is urged apart by a cam interposed therebetween. As one of ordinary skill in the art will understand, mechanical linkages of cam apparatus 390 may be fabricated, for example and without limitation, to be comprised of: (a) belts and pulleys; (b) cranks and linkages; (c) cables and pulleys; (d) electromechanical actuators; (e) pneumatic actuators; or (f) wedges linked to actuators. In addition, one of ordinary skill in the art will also understand that mounting plate 392 may include vacuum channels for holding devices $394_n$ against mounting plate 392 during the process of inserting devices into apertures in a carrier fabricated in accordance with one or more embodiments of the present invention. In further addition, and in accordance with one or more such embodiments, a temperature of mounting plate 392 may be set to a fixed temperature using any one of a number of methods that are well known to those of ordinary skill in the art to facilitate opening or closing the pair of prongs around each aperture. In still further addition, and in accordance with one or more such embodiments, mechanical vibration may be used to seat properly the devices in their respective apertures, which mechanical vibration may be generated using any one of a number of methods that are well known to those of ordinary skill in the art such as, for example and without limitation, applying ultrasonic, sonic, or subsonic vibrations.

In accordance with one or more embodiments of the present invention, cam apparatus 390 is incorporated into automatic device handling equipment known in the art as a "handler." In accordance with one or more such embodiments of the present invention, cam apparatus 390 is incorporated into a wafer picker to enable devices picked from a wafer to be mounted in a carrier using a pick and place robot. In addition, in accordance with one or more embodiments of the present invention, cam apparatus 390 is incorporated into a taping machine to enable devices to be picked from a carrier by a pick and place robot and placed into pockets in a shipping tape, for example and without limitation, a tape of the type commonly used to ship microelectronic devices. In further addition, in accordance with one or more embodiments of the present invention, cam apparatus 390 is used in conjunction with a second cam apparatus 390 to enable devices to be picked from one carrier by a pick and place robot and to be placed in a second carrier. In yet further addition, in accordance with one or more embodiments of the present invention, a combination of several such cam apparati may be used to pick devices from one carrier and to place them in appropriate other carriers as determined, for example and without limitation, by results of tests on the devices.

Figure 5A:
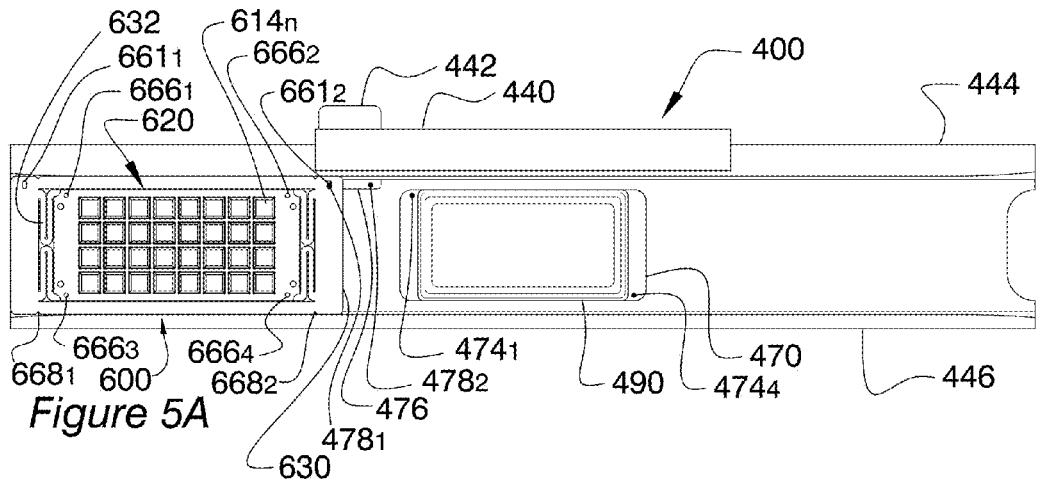
FIG. 5A is a top view of a transport mechanism with a carrier in an input position, which transport mechanism and carrier are fabricated in accordance with one or more embodiments of the present invention.

According to one or more embodiments of the invention, carriers are transported onto and off a test position by a transport mechanism. At the test position, electrical contact is made to devices held in a tray of the carrier by moving the tray in a direction substantially perpendicular to, for example and without limitation, a plane of a frame of the carrier to bring the devices held in the tray into contact with a contactor block. FIGS. 5A to 5F help illustrate steps in transporting and testing microelectronic devices $614_n$ held in tray 620 of carrier 600. FIG. 5A shows a top view of transport mechanism 400 with carrier 600 positioned on rails 444 and 446 in an input position of transport mechanism 400. As shown in FIG. 5A, test head 490 is juxtaposed over contactor 470 at a test position.

In operation, transport mechanism 400 brings carrier 600 under test head 490. Then, test head 490 clamps down onto carrier 600, thereby urging devices $614_n$ into contact with contactor block 470. As shown in FIG. 5A, alignment holes $666_1$-$666_4$ in tray 620 and notches $668_1$ and $668_2$ in frame 630 are used for positioning devices $614_n$ held in carrier 600 in the manner to be described below.

Figure 5B:
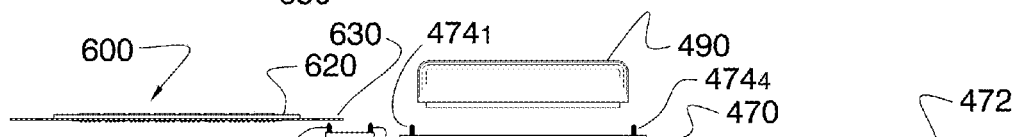
FIGS. 5B-5F are simplified side views of the transport mechanism and the carrier shown in FIG. 5A which help illustrate a sequence of steps for moving the carrier from an input position to a test position.
Figure 5C:
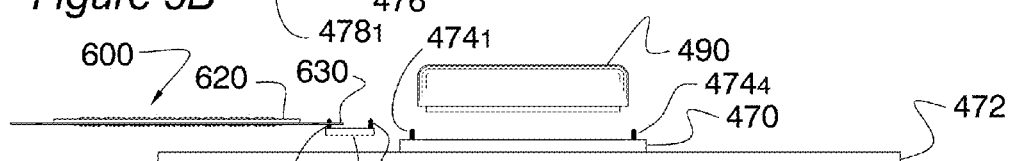
Figure 5D:
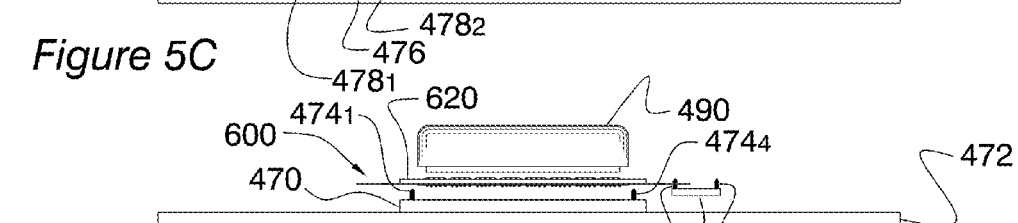
Figure 5E:
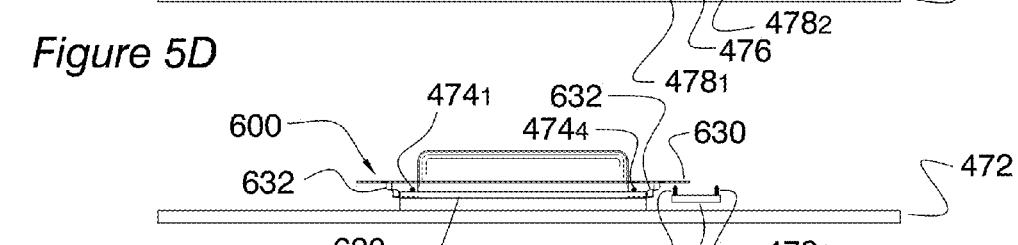
Figure 5F:
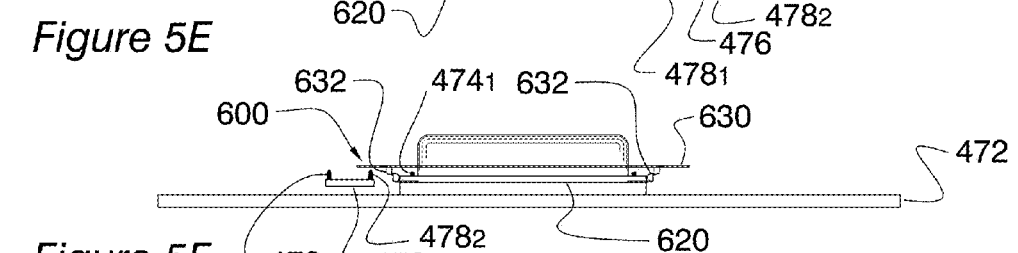

FIGS. 5B-5F are simplified side views of transport mechanism 400 (also referred to as transporter 400) and carrier 600 which help illustrate a sequence of steps in transporting and contacting devices $614_n$ for electrical test on contactor block 470 that is electrically connected to test interconnection means 472 (for example, a printed wiring substrate). As shown in FIGS. 5B-5F, test head 490 is juxtaposed to contactor block 470 and printed wiring substrate 472 at a test position (for clarity of exposition and ease of understanding, rails 444 and 446, actuator 440, and trolley 442 are not shown in FIGS. 5B-5F). In a first step in a test procedure, and as shown in FIG. 5B, carrier 600 is mounted on transporter 400 in an input position. As shown in FIG. 5B, a gap between a bottom of test head 490 and a top of contactor block 470 enables lateral translation of carrier 600 to a test position interposed between test head 490 and contactor block 470. Next, in a second step, and as shown in FIG. 5C, pin carrier 476 (for example, a fixture for holding pins used to transport carriers) is raised, for example and without limitation, by a pneumatic actuator, an electromagnetic actuator, a mechanical cam or other actuator in a manner that is well known to those of ordinary skill in the art), thereby urging engagement pin $478_1$ into an engagement feature of carrier 600, for example and without limitation, slot $661_2$ in frame 630 of carrier 600 (refer to FIG. 5A wherein slot $661_2$ is partially obscured by pin $478_1$ engaged therein). Next, in a third step, and as shown in FIG. 5D, pneumatic actuator 440 of transporter 400 is activated to move trolley 442 and attached pin carrier 476, thereby slidably moving carrier 600 along rails 444 and 446 by action of pin $478_1$ acting upon slot $661_2$. As carrier 600 moves into the test position between test head 490 and contactor block 470, its presence is sensed by reflective optical detector 447 which is actuated when carrier 600 reaches a set position along rails 444 and 446 (in accordance with one or more further embodiments of the present invention, other types of detectors that are well known to those of ordinary skill in the art may be used in place of optical detectors such as, for example and without limitation, proximity detectors). When carrier 600 reaches the set position and detector 447 is actuated, the carrier is locked in position, for example and without limitation, by engagement of shot pins (not shown) with notches $668_1$ and $668_2$ in frame 630. Next, in a fourth step, and as shown in FIG. 5E, test head 490 is moved downwardly toward contactor block 470, thereby urging tray 620 and devices $614_n$ contained therein into contact with contactor block 470. As tray 620 is moved downwardly, alignment pins $474_1$ and $474_4$ of contactor block 470 engage alignment features $666_1$ and $666_4$ of tray 620, respectively, thereby bringing tray 620 and devices $614_n$ into registration with contactor block 470 (in particular, registration refers to alignment of terminal pads on microelectronic device devices $614_n$ to contactors of a mating socket of contactor block 470). In accordance with one or more embodiments of the present invention, flexure of flexural springs 632 enables tray 620 to move in a direction perpendicular to frame 630 while frame 630 remains stationary on rails 444 and 446. Next, pin carrier 476 is dropped, whereby pin $478_1$ is disengaged from alignment feature hole $661_2$. Next, in a fifth step, as shown in FIG. 5F, pin carrier 476 is returned to its initial position, i.e., as seen in FIG. 5B, in readiness for engagement with a next carrier that moves into the input position.

Figure 6A:
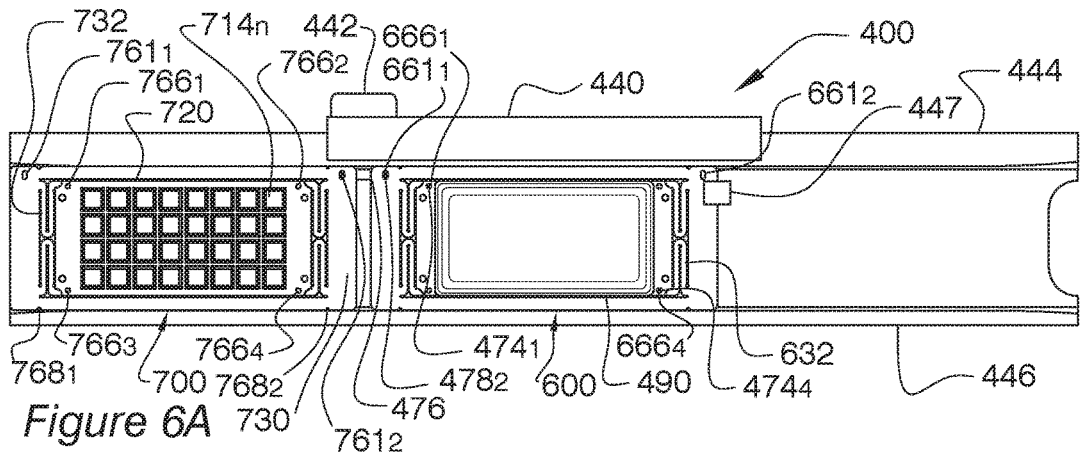
FIG. 6A is a top view of a transport mechanism with a first carrier in a test position under a test head and a second carrier in an input position, which transport mechanism and carriers are fabricated in accordance with one or more embodiments of the present invention.
Figure 6B:
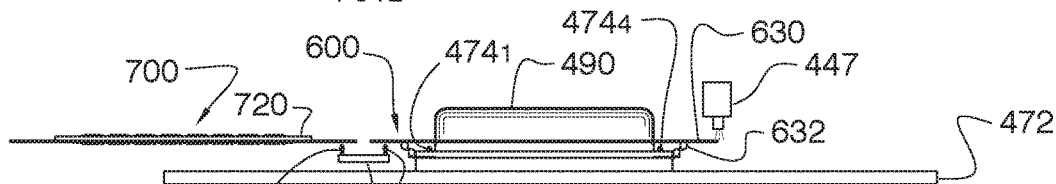
FIGS. 6B-6F are simplified side views of the transport mechanism and the first and second carriers shown in FIG. 6A which help illustrate a sequence of steps for moving the first carrier from the test position to an output position while simultaneously moving the second carrier from the input position to the test position.
Figure 6C:
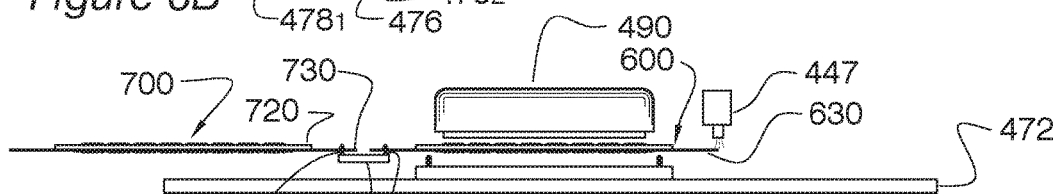
Figure 6D:
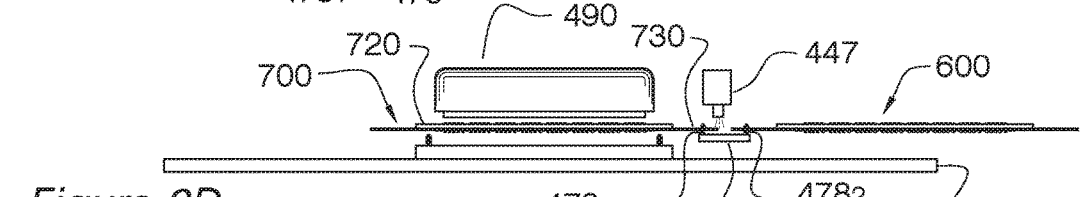
Figure 6E:
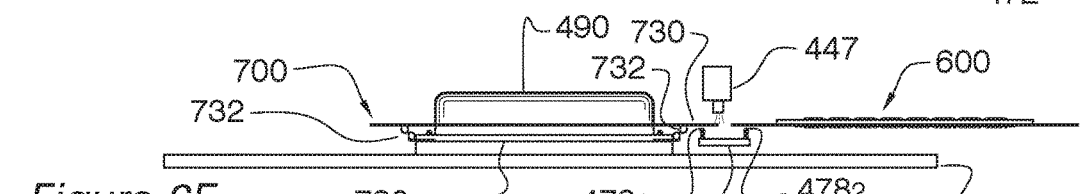
Figure 6F:
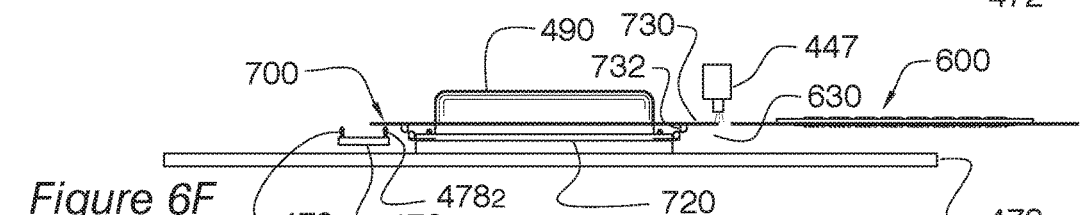

FIG. 6A is a top view of transport mechanism 400 with carrier 600 in a test position under test head 490 and carrier 700 in an input position, which transport mechanism 400 and carriers 600 and 700 are fabricated in accordance with one or more embodiments of the present invention. FIGS. 6B-6F are simplified side views of transport mechanism 400 and carriers 600 and 700 which help illustrate a sequence of steps for moving carrier 600 from the test position to an output position while simultaneously moving carrier 700 from the input position to the test position. In a step in a test procedure, and as shown in FIG. 6B, carrier 700 is mounted on transporter 400 in an input position. In a next step, and as shown in FIG. 6C, pin carrier 476 is raised, thereby urging engagement pin $478_1$ into an engagement feature of carrier 700, for example and without limitation, slot $761_2$ of frame 730 of carrier 700 (refer to FIG. 6A wherein slot $761_2$ is partially obscured by pin $478_1$ engaged therein) while also urging engagement pin $478_2$ into an engagement feature of carrier 600, for example and without limitation, slot $661_1$ of frame 630 of carrier 600. In a next step, as shown in FIG. 6D: (a) test head 490 is raised to enable flexural springs 632 to resiliently return tray 620 to a retracted configuration and extract devices $614_n$ from contactor block 470 (the term "retracted configuration" refers to a configuration of carrier 600, and hence springs 632 of frame 630, for example and without limitation, where no external forces other than gravity act upon tray 620); (b) shot pins are retracted; and (c) carrier 600 is removed from the test position and carrier 700 is moved to the test position simultaneously, by the action of pneumatic actuator 440 moving trolley 442 and attached pin carrier 476. As a result, pins $478_1$ and $478_2$ slidably move carriers 700 and 600, respectively, along rails 444 and 446. As carrier 700 moves into juxtaposition with contactor block 470, detector 447 is actuated and shot pins (not shown) in rail 446 are fired, and they engage notches $768_1$ and $768_2$, thereby stopping motion of carrier 700 along the rails and locking carrier 700 in position. In a next step, a shown in FIG. 6E, test head 490 is moved downwardly toward juxtaposed contactor block 470, thereby urging tray 720 and devices $714_n$ held therein against contactor block 470- flexural springs 732 flex to enable tray 720 to be deflected downwardly while frame 730 of carrier 700 remains on rails 444 and 446. Pin carrier 476 is retracted, thereby disengaging pins $478_1$ and $478_2$ from slots $761_2$ and $661_1$ respectively. In a next step, as shown in FIG. 6F, pin carrier 476 is returned to its initial position, i.e., as seen in FIG. 6B, by actuation of pneumatic actuator 440, thereby moving trolley 442 and pin carrier 476 mounted thereto.

FIG. 7A is a top view of transport mechanism 400 with carrier 600 in an output position, carrier 700 in a test position under test head 490, and carrier 600 in an input position, which transport mechanism 400 and carriers 600, 700 and 800 are fabricated in accordance with one or more embodiments of the present invention. FIGS. 7B-7F are simplified side views of transport mechanism 490 and carriers 600, 700 and 800 which help illustrate a sequence of steps for moving carrier 600 from the output position, and subsequently for moving second carrier 700 from the test position to the output position while simultaneously moving carrier 800 from the input position to the test position. For clarity of exposition and ease of understanding, enumeration of repeated labeled elements is omitted. In operating transport mechanism 400 in accordance with one or more embodiments of the present invention, carriers are moved in sequence through input, test, and output positions repetitively. In a step in a test procedure, and as shown in FIG. 7B, carrier 800 is moved into the input position of transport mechanism 400. To do this, for example, starting from the configuration shown FIG. 6F, test head 490 is retracted from tray 720, thereby enabling tray 720 to relax resiliently to a retracted configuration in which carrier 700 is unencumbered by engagement with either test head 490 or contactor block 470 or with associated alignment pins $474_1$ and $474_4$. Then, in accordance with one or more embodiments of the present invention, transport mechanism 400 awaits removal of carrier 600 from the output position before proceeding to the next step. In a next step, and as shown in FIG. 7C, pin carrier 476 is raised, thereby urging engagement pins $478_1$ and $478_2$ into engagement features of carriers 800 and 700, for example and without limitation, slot $861_2$ of frame 830 of carrier 800 and slot $761_1$ of frame 730 of carrier 700, respectively. Then shot pins (not shown are disengaged from notches $768_1$ and $768_2$, freeing carrier 700 to move along rails 444 and 446. In a next step, as shown in FIG. 7D, carriers 700 and 800 are slidably moved simultaneously along rails 444 and 446 by traction of pins $478_1$ and $478_2$ of pin carrier 476 mounted to trolley 442, which trolley 442 is moved by pneumatic actuator 440. As carrier 800 moves into juxtaposition with contactor block 470, as sensed by detector 447, shot pins (not shown) in rail 446 are fired and they engage notches $868_1$ and $868_2$, thereby locking carrier 800 in position. In a next step, as shown in FIG. 7E, test head 490 is moved downwardly toward juxtaposed contactor block 470, thereby urging tray 820 and devices $814_n$ held therein against contactor block 470 to establish contact between contactor block 470 and devices $814_n$ held in tray 820. Next, pin carrier 476 is retracted, thereby disengaging pins $478_1$ and $478_2$ from slots $861_2$ and $761_2$, respectively. In a next step, as shown in FIG. 7F, pin carrier 476 is returned to its initial position, i.e., as seen in FIG. 7B, by actuation of pneumatic actuator 440, thereby moving trolley 442 and pin carrier 476 mounted thereto.

One of ordinary skill in the art will understand that steps of the test sequence may be executed in other combinations in which an important part is the simultaneous movement of two carriers by motion of a trolley temporarily engaged with each of the two carriers.

Operation of test head 490 with a carrier at a test position in accordance with one or more embodiments of the present invention is described in conjunction with FIGS. 8A-8D. FIG. 8A is a top view of a test position wherein test head 490 is positioned over tray 200 which is coupled to frame 230 of carrier 200. As shown in FIG. 8A, shot pins 452 and 454 of rail 446 engage notches $261_3$ and $261_4$, respectively, of frame 230, thereby stopping motion of carrier 200 along rails 444 and 446 and holding carrier 200 against a reference surface of rail 444. After moving carrier 200 into the test position, pin carrier 476 (with pins $478_1$ and $478_2$) is returned to an initial position by activating actuator 440, thereby moving trolley 442 into a position shown in FIG. 8A. In the test position, alignment pins $474_1$ and $474_4$ of contactor 470 underlie alignment holes $266_1$ and $266_4$, respectively, of tray 220.

FIGS. 8B-8D are cross sectional views of the test position shown in FIG. 8A that help illustrate successive stages of its operation. In a first step, as shown in FIG. 8B, carrier 200 is transported on rails 444 and 446 to the test position where tray 220 is interposed between test head 490 and contactor block 470. During transport, devices $214_n$ in tray 220 move above contactor block 470 without mechanical interference therebetween because tray 220 is in a retracted configuration wherein tray 220 is supported on a plane above a top surface of contactor block 470. As shown in FIG. 8B, tray 220 is coupled by flexural springs 232 to frame 230 in the retracted configuration wherein flexural springs 232 are relaxed (relaxed is understood herein to mean that no significant external forces cause flexural springs 232 to be deformed from an unloaded state).

In a next step, as shown in FIG. 8C, test head 490 urges tray 220 to an extended configuration wherein tray 220 is displaced in a direction perpendicular to a plane of frame 230 to an extent sufficient to bring tray 220 into contact with contactor block 470. In accordance with one or more embodiments of the present invention, flexural springs 232 enable tray 220 to move relative to frame 230, and enable backing plate 488 to urge devices $214_n$ into contact with mating connectors (not shown) of contactor block 470. In accordance with one or more such embodiments, and as shown in FIG. 8B: (a) seal ring 493 of test head 490 (for example and without limitation, an O-ring such as a silicone or elastomeric O-ring, or other sealing surface such as, for example and without limitation, a flat surface) is juxtaposed with top sealing surface 202 of seal band 224 of tray 220 (which seal band 224 and top sealing surface 202 encircle test devices $214_n$); and (b) seal ring 494 of contactor block 470 (for example and without limitation, an O-ring such as a silicone or elastomeric O-ring, or other sealing surface such as, for example and without limitation, a flat surface) is juxtaposed with bottom sealing surface 204 of tray 220 (which bottom sealing surface 204 encircle test devices $214_n$). In accordance with one or more such embodiments, and as shown in FIG. 8C, when test head 490 is moved downward: (a) test head 490 is brought into contact with tray 220, seal ring 493 is brought into contact with top sealing surface 202; and (b) as test head 490 is moved further downward, bottom sealing surface 204 is brought into contact with seal ring 494 of contactor block 470. In addition, as shown in FIGS. 8B-8D, contactor block 470 is sealed to printed wiring substrate 472 by seal ring 495 (for example and without limitation, an O-ring such as a silicone or elastomeric O-ring, or other sealing surface such as, for example and without limitation, a flat surface). After moving and urging as described above in conjunction with FIG. 8C, devices $214_n$ are enclosed within a sealed chamber (also referred to as a "test cell") comprising cavity 491 of test head 490, tray 220, contactor block 470, and printed wiring substrate 472.

In a next step, as shown in FIG. 8D, tray 220 is in the extended configuration while backing plate 488 (as used herein, the term "backing plate refers to a plate that clamps the devices to the contactor block such as, for example and without limitation, a thermal transfer or exchange plate, a cold plate or a heat sink) is urged into contact with the array of devices $214_n$ under test. In accordance with one or more such embodiments, backing plate 488 is moved downward into thermal and mechanical contact with devices $214_n$, and as such, it urges terminals (not shown) on devices $214_n$ into contact with contacts (not visible) on contactor block 470. In accordance with one or more such embodiments, pneumatic cylinder actuator 486 moves backing plate 488 in an upward or downward direction relative to test head 490, thereby providing a controlled force on devices $214_n$ to establish good thermal contact between backing plate 488 and devices $214_n$ as well as to establish good electrical contact between terminals (not shown) on devices $214_n$ and corresponding contacts (not shown) on contactor block 470. In the test step described in conjunction with FIG. 8D, a gas (for example and without limitation, nitrogen, forming gas, hydrogen, helium, dry air and mixtures thereof) may be introduced through port 499 of test head 490 into sealed cavity 491 to reduce moisture condensation and to increase thermal efficiency. In accordance with one or more embodiments, channels 482 of backing plate provide a path for thermal transfer fluid to flow through backing plate 488 to regulate temperature of backing plate 488.

In accordance with one or more embodiments of the present invention, after the test operation is carried out, backing plate 488 is raised, thereby releasing pressure on devices $214_n$ and enabling tray 220 to return to the retracted configuration shown in FIG. 2B wherein carrier 200 and devices $214_n$ held therein may be moved on rails 444 and 446 without mechanical interference between devices $214_n$ and test head 490, backing plate 488 or contactor block 470.

Figure 9A:
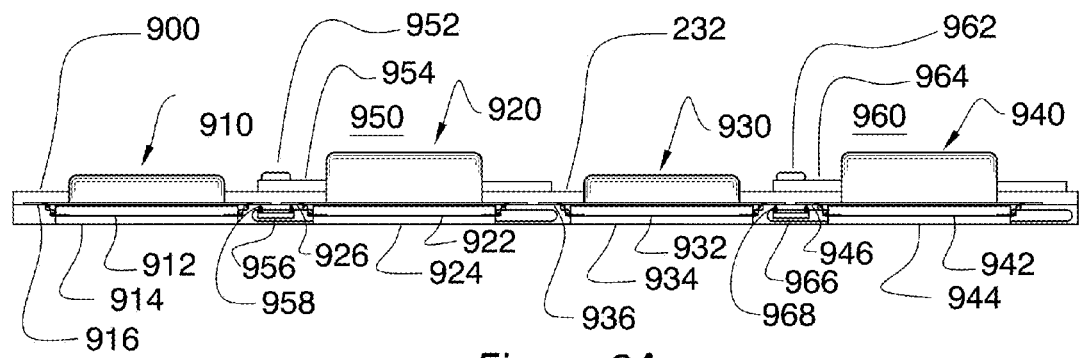
FIG. 9A is a cross sectional view of concatenated transport mechanisms moving devices in carriers through a sequence of thermal soaking and testing operations.
Figure 9B:
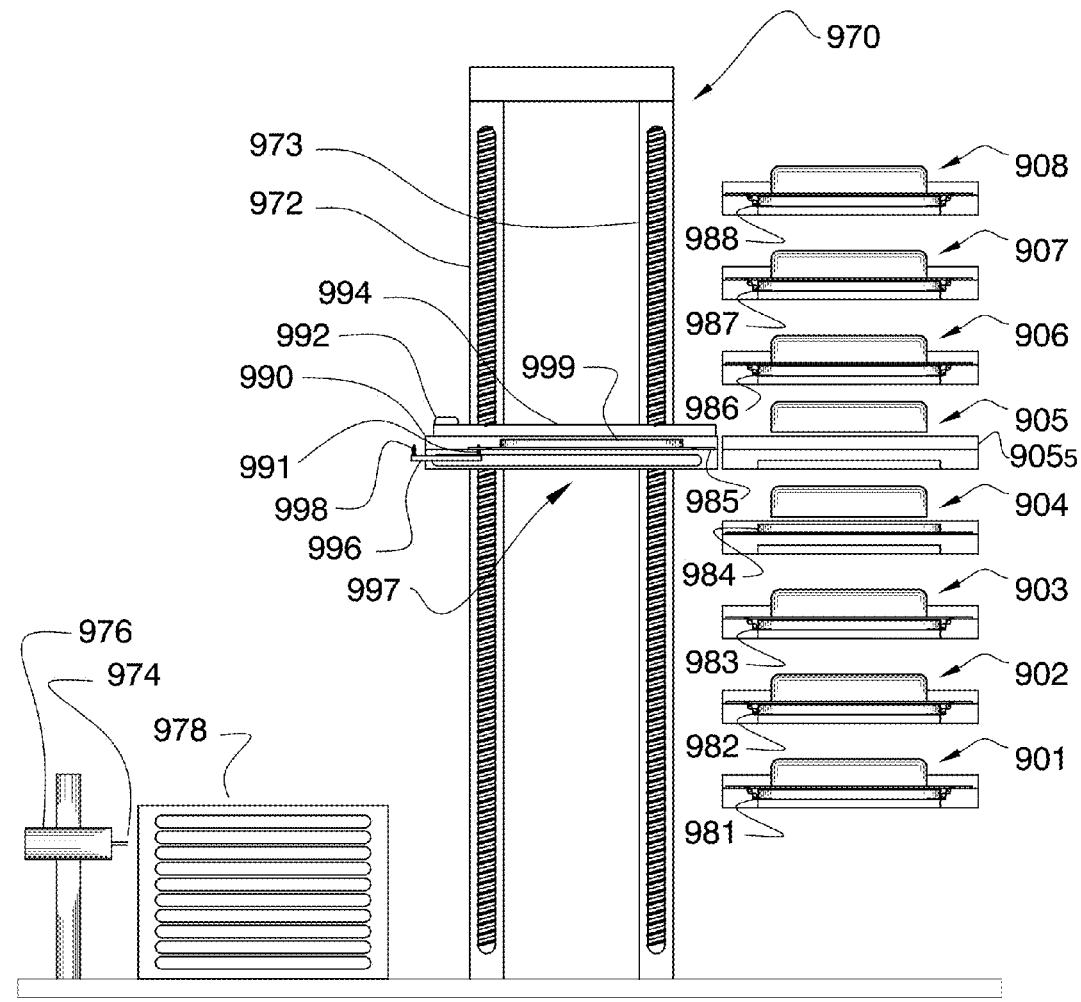
FIG. 9B is a cross sectional view of an array of test pods fed by an automatic loader that is fabricated in accordance with one or more embodiments of the present invention.

A carrier that is fabricated in accordance with one or more embodiments of the present invention may have a variety of uses in testing of microelectronic devices such as, for example and without limitation, wafer picking, burn-in, functional test, stress test, laser trim, marking, reflow of solder balls, and dynamic programming. FIGS. 9A and 9B illustrate several applications for one or more embodiments of the carrier. In particular, FIG. 9A is a cross sectional view of concatenated transport mechanisms that move devices in carriers through a sequence of thermal soaking and testing operations. As shown in FIG. 9A, trays 912, 922, 932 and 942 of carriers 916, 926, 936 and 946, respectively, are transported on rails 900 through a sequence of, for example and without limitation, thermal conditioning pods 910 and 930 and test pods 920 and 940. Arrays of devices (not visible in FIG. 9A) held in trays 912, 922, 932 and 942 may be shuttled from one process location to another by means of automated transport that is effected by the chain of transporters 950 and 960 where the operation of each of transporters 950 and 960 has been described above in conjunction with FIGS. 5A-7F. By way of example, carrier 926 is transported from pod 920 to pod 930 by activating actuator 954 which causes trolley 952, and carrier 926 attached temporarily thereto by pin 958 of pin carrier 956, to move to the right (as seen in FIG. 9A). In a subsequent step, carrier 926 is transported from pod 930 to pod 940 by activating actuator 964 which causes trolley 962, and carrier 926 attached thereto by pin 968 of pin carrier 966, to move to the right (again as seen in FIG. 9A). By way of example, and without limitation: (a) pod 910 is a thermal soak station with heater 914 set to establish a temperature of $T_1$ on devices enclosed therein; (b) pod 920 is a test station for testing electrically at a temperature $T_1$ devices in tray 922 in contact with contactor block 924; (c) pod 930 is a pre-heat station with heater 934 set to establish a temperature $T_2$ on devices enclosed therein; and (d) pod 940 is a test station for testing devices in tray 942 in contact with contactor block 944 at temperature $T_2$. In accordance with one or more embodiments of the present invention, arrays of devices held in trays may be moved through a sequence of tests performed at different temperatures by concatenating pre-heat and test locations along rails or other suitable transport means. As one of ordinary skill in the art can readily appreciate, the carrier may be used to transport arrays of devices into position automatically for a wide range of process and test operations.

A tray transport apparatus fabricated in accordance with one or more embodiments of the present invention may be used to move devices automatically through a burn-in process. In particular, FIG. 9B is a cross sectional view of an array of test pods fed by an automatic loader that is fabricated in accordance with one or more embodiments of the present invention. As shown in FIG. 9B, one of burn-in pods 901-908, shown as pod 905, is open and ready to receive tray 999.

As further shown in FIG. 9B, pusher 974 on actuator 976 moves carrier 985 out of magazine 978 (as used herein, a magazine is, for example and without limitation, a cassette for holding a plurality of trays) to a position where, for example, pin 998 on pin carrier 996 of transport apparatus 997 (which is fabricated in accordance with one or more embodiments of the present invention) may engage carrier 985 near a right end thereof. After engagement, transport apparatus 997 moves carrier 985 on rails 990 by activating actuator 994, thereby moving trolley 992, and carrier 985 temporarily attached thereto by pin 998 on pin carrier 996, to the right (as seen in FIG. 9B). As a next step, trolley 992 is returned to its initial position (as shown in FIG. 9B) by actuator 994. As a next step, elevators 972 and 973 of automatic loader 970 (which elevators are well known to those of ordinary skill in the art) raise transport apparatus 997 (and hence, carrier 985) in a vertical direction so that rails 990 are aligned with available burn-in pod 905. As a further next step, pin 991 on pin carrier 996 engages carrier 985 near the left end thereof, thereby enabling actuator 994 to transport carrier 985 into position in burn-in pod 905 by moving trolley 992 and attached pin 991 on pin carrier 996 to the right (as seen in FIG. 9B). Carrier 985 is transported from rails 990 to rails $905_5$ which straddle burn-in pod 905.

After burn-in, testing during burn-in, run-in, or other stress testing, transport apparatus 997 removes carrier 985, with devices therein, from burn-in pod 905, and transports it, for example and without limitation, in conjunction with automatic loader 970, to a next process step, or alternatively, to magazine 978.

Burn-in pods 901-908 may be provided with thermal transfer plates, clamping mechanisms, air circulation means, vibration mechanisms, mechanical shock mechanisms, sealed chambers, and drive electronics to facilitate a range of stress tests on the devices in carriers 981-988, respectively. Connections are made to an array of devices under test in burn-in pods 901-908 by means of burn-in boards, flexible circuits, rigid flex, high speed cables or other high performance interconnects that allow location of test electronics in close proximity to the devices under test in order to perform testing at high speeds without the encumbrance of long interconnect cables.

As one of ordinary skill in the art will readily appreciate, the steps described above in conjunction with FIGS. 5A-9B may be carried out in response to commands provided by a controller (not shown for ease of understanding) such as, for example, a processor, microprocessor, computer and the like. In addition, one of ordinary skill in the art will be able to program such a controller routinely and without undue experimentation in light of the description presented herein. For example and without limitation, the steps may be presented to the controller in the form of a "recipe" or a data structure comprised of a collection of data pertaining to various process steps to be carried out for test and/or burn-in operations.

Embodiments of the present invention described above are exemplary. As such, many changes and modifications may be made to the description set forth above by those of ordinary skill in the art while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. An apparatus for transporting carriers of devices, the apparatus comprising:
   a track with two or more rails adapted to support carriers moveably;
   a first pin attached to a trolley and a second pin attached to a trolley, each of which pins is adapted to engage a feature in each of the carriers;
   a first actuator adapted to raise and lower the first pin that may engage and release, respectively, the feature in the first carrier and a second actuator adapted to raise and lower the second pin that may engage and release, respectively, the feature in the second carrier simultaneously; and
   a linear actuator adapted to move the trolley along a direction parallel to the track so that activation of the linear actuator when the first and second pins are engaged moves the first carrier onto a test site and moves the second carrier off the test site simultaneously.

2. The apparatus of claim 1 wherein the carrier comprises:
   a frame supported on the rails;
   a tray with apertures for holding the devices, which tray is resiliently coupled to the frame so the tray is adapted to move resiliently with respect to the rails and the frame.

3. The apparatus of claim 2 wherein a test head juxtaposed with a contactor is movable toward the contactor, thereby urging the devices held in the tray into contact with the contactor.

4. The apparatus of claim 3 wherein the test head comprises:
   a cavity encircled by a seal ring wherein the vertical motion of the test head urges the seal ring into contact with a seal band encircling the devices in the tray, thereby forming a chamber enclosing the devices.

5. An apparatus for moving a carrier holding a plurality of devices into alignment at a predetermined site, the apparatus comprising:
   a track adapted to support the carrier, the track comprising a first rail and a second rail;
   an actuator adapted to move the carrier along a direction parallel to the track;
   a shot pin located in the first track;
   an actuator for moving the shot pin in a direction toward the second track;
   a detector for sensing a set position of the carrier at the test site;
   wherein:
   the shot pin is shaped to engage a notch in a side of the carrier; and
   the actuator is activated as the carrier moves through the set position at the test site, thereby urging the shot pin into engagement with the carrier;
   whereby motion of the carrier is stopped at the set position by the engagement of the shot pin in the notch.

6. The apparatus of claim 5 wherein urging of the shot pin into engagement with the carrier urges the carrier into alignment against the second rail.

7. The apparatus of claim 5 wherein the detector is an optical detector.

8. The apparatus of claim 5 wherein the detector is a proximity detector.

9. The apparatus of claim 5 wherein the carrier is a flexible carrier comprising:
   a tray with apertures for holding the plurality of devices; and
   a frame wherein the tray is depended on flexural springs from the frame thereby allowing movement of the tray relative to the track supporting the carrier.

10. A transport apparatus for moving carriers of microelectronic devices along a track, the transport apparatus comprising:
    a track with two rails adapted to support the carriers;
    a trolley adapted to be transported in a direction along the track by a linear actuator;
    a first and a second engagement feature attached to the trolley wherein the first engagement feature is adapted to engage temporarily with a first of the carriers, and the second engagement feature is adapted to engage temporarily with a second of the carriers;
    wherein a predetermined movement of the trolley slidably moves the first carrier onto a test position and slidably moves the second carrier off the test position simultaneously.

11. The transport apparatus of claim 10 further comprises a linear actuator adapted to move the trolley.

12. The transport apparatus of claim 11 wherein the linear actuator is a rodless pneumatic cylinder.

13. The transport apparatus of claim 11 wherein the linear actuator is a belt drive transmission driven by an electric motor.

14. The transport apparatus of claim 10 wherein the first engagement feature and the second engagement feature are a first pin and a second pin, respectively.

15. The transport apparatus of claim 14 wherein the first pin and the second pin are mounted to a pin carrier which pin carrier is adapted to be actuated to raise the first pin and the second pin to engage the first carrier and the second carrier, respectively.

16. A method for transporting microelectronic devices onto and off of a test contactor simultaneously, the method comprising:
   providing two carriers wherein a tray holding a plurality of the devices is attached to each of the two carriers;
   providing a track for slidably holding the two carriers;
   disposing a first carrier an input position on the track;
   disposing a second carrier at a test position on the track;
   providing one or more trolleys and an actuator for moving the one or more trolleys in a direction along the track;
   providing a test head and a juxtaposed socket at the test position;
   providing engagement means for temporarily linking each of the carriers to a trolley;
   temporarily linking each of the carriers to a trolley;
   activating the actuator to move the one or more trolleys, thereby simultaneously moving the second carrier onto the test position and moving the second flexible carrier onto an output position; and
   performing a test on the microelectronic devices held in the second tray.

17. The method of claim 16 wherein providing two carriers includes providing two trays resiliently attached to the carrier wherein the tray is movable in a direction perpendicular to the tray.

18. The method of claim 16 wherein performing a test includes moving the test head toward the contactor whereby the devices are moved toward the contactor and urged into contact with the contactor.

* * * * *